(12) United States Patent
Strayer et al.

(10) Patent No.: US 7,906,735 B2
(45) Date of Patent: Mar. 15, 2011

(54) ELECTRICALLY CONDUCTIVE DYNAMIC ENVIRONMENTAL SEAL

(75) Inventors: James D. Strayer, Huntington Beach, CA (US); Daniel P. Brown, Long Beach, CA (US); Patricia S. Dean, Redondo Beach, CA (US)

(73) Assignee: Raytheon Company, Waltham, MA (US)

( * ) Notice: Subject to any disclaimer, the term of this patent is extended or adjusted under 35 U.S.C. 154(b) by 21 days.

(21) Appl. No.: 11/825,232

(22) Filed: Jul. 5, 2007

(65) Prior Publication Data

US 2009/0008147 A1 Jan. 8, 2009

(51) Int. Cl.
*H01R 4/48* (2006.01)
*H05K 9/00* (2006.01)

(52) U.S. Cl. ......... 174/368; 174/369; 277/648; 277/920

(58) Field of Classification Search ............ 174/367, 174/368, 369; 361/816, 818; 277/920, 648, 277/650
See application file for complete search history.

(56) References Cited

U.S. PATENT DOCUMENTS

| | | | |
|---|---|---|---|
| 2,454,567 A * | 11/1948 | Pierson, Jr. .................. 174/351 |
| 2,885,459 A | 5/1959 | Pulsifer at al. | |
| 4,218,507 A * | 8/1980 | Deffeyes et al. ............. 428/328 |
| 4,807,891 A | 2/1989 | Neher | |
| 4,807,981 A * | 2/1989 | Takizawa et al. ............. 359/498 |
| 5,134,244 A * | 7/1992 | Balsells ..................... 174/352 |
| 5,202,536 A | 4/1993 | Buonanno | |
| 5,313,016 A | 5/1994 | Brusati et al. | |
| 5,756,921 A | 5/1998 | Dacko et al. | |
| 6,219,906 B1 * | 4/2001 | Sosnowski .................. 29/825 |
| 6,426,458 B1 * | 7/2002 | Hinzpeter et al. ........... 174/375 |
| 6,528,720 B1 * | 3/2003 | Bakker et al. ............... 174/377 |
| 2002/0074141 A1 * | 6/2002 | Kaufman .................. 174/35 R |
| 2003/0117787 A1 * | 6/2003 | Nakauchi ................... 361/818 |

FOREIGN PATENT DOCUMENTS

| | | |
|---|---|---|
| EP | 0310945 A | 4/1989 |
| GB | 2135533 A | 8/1984 |
| JP | 11-145670 * | 5/1999 |

* cited by examiner

*Primary Examiner* — Hung V Ngo
(74) *Attorney, Agent, or Firm* — Pillsbury Winthrop Shaw Pittman LLP

(57) ABSTRACT

A seal including a base and a conductor mounted to conduct current from a source disposed on a first side of said base to a sink disposed on a second side of said base. In the illustrative embodiment, the base is annular (ring-shaped) and fabricated of airtight, watertight and/or electrically insulating and/or conductive material such as rubber, Teflon®, silver impregnated Teflon®, or other suitable substance. In the illustrative embodiment, the conductor is a single strip of conductive material and the base has a recess to allow for deflection thereof. In the best mode, plural conductors are mounted within the annular base. Each conductor has a brush at each end thereof. The brushes are provided by a split(s) at the end of each strip effective to create multiple fingertips. Each strip is secured at an angle in a slot in the base and retained further by an anchor. The anchor is integral with the strip and transverse to the longitudinal axis thereof.

31 Claims, 4 Drawing Sheets

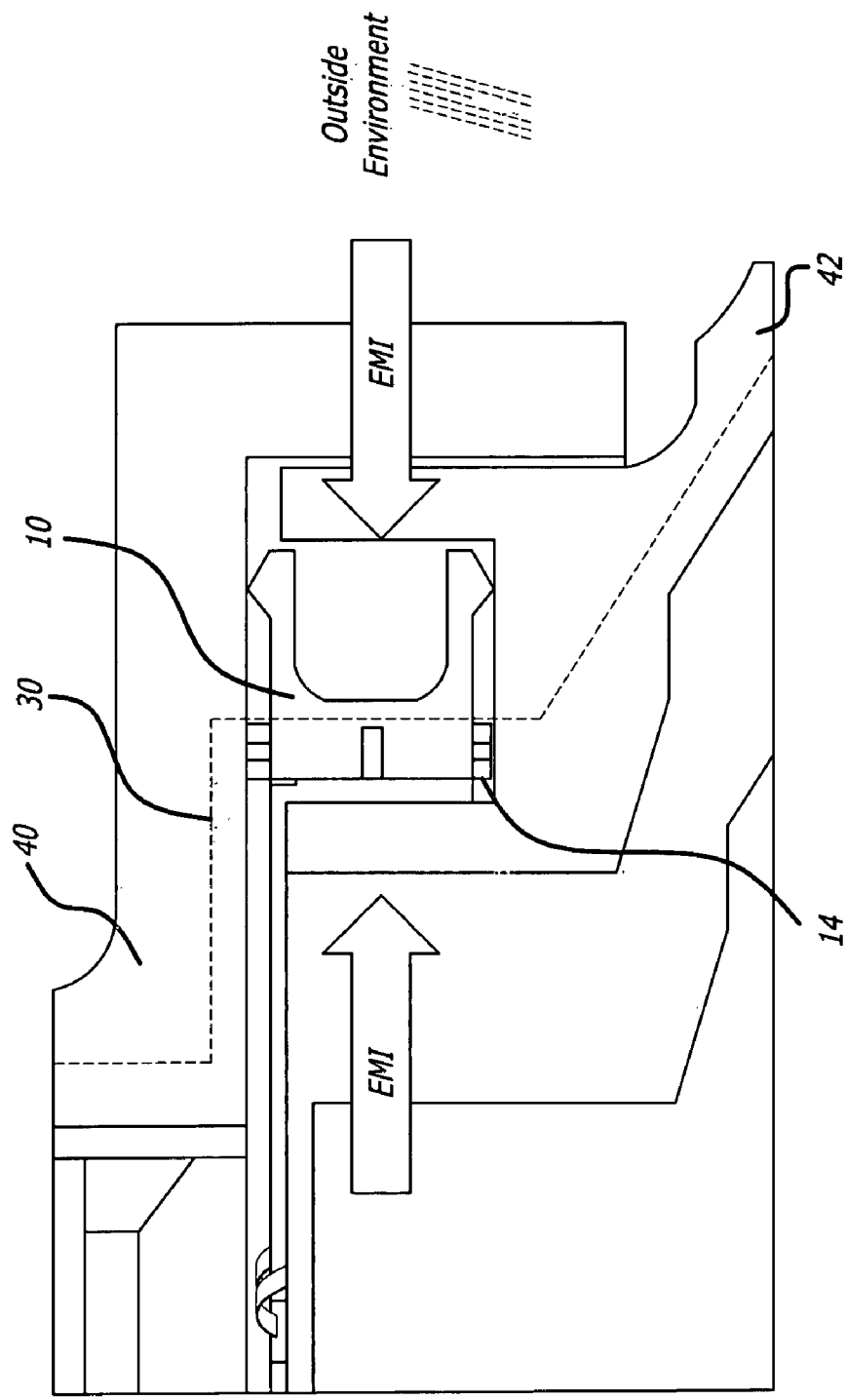

ELECTRICALLY CONDUCTIVE DYNAMIC ENVIRONMENTAL SEAL

BACKGROUND OF THE INVENTION

1. Field of the Invention

The present invention relates to electrical and electronic components. More specifically, the present invention relates to environmental and electromagnetic seals.

2. Description of the Related Art

Turret assemblies hang on/under multiple airborne and ground based operational platforms including, but not limited to, helicopters, unmanned aerial vehicles, fixed wing aircraft, ground and marine vehicles. As the sophistication of these turret assemblies develops with advances in technology and war-fighting capabilities, electromagnetic interference issues are continuously on the rise.

Electromagnetic interference (EMI) is electromagnetic radiation emitted by electrical circuits carrying rapidly changing signals, as a by-product of their normal operation, which causes unwanted signals (interference or noise) to be induced in other circuits. This interrupts, obstructs, or otherwise degrades or limits the effective performance of those other circuits. EMI can be induced intentionally, as in some forms of external electronic warfare or unintentionally as a result of spurious emissions and the like. EMI emissions can cause severe operational platform complications such as flight, guidance, and weapon control interference. In addition, any system emitting large EMI emissions can easily be detected, and tracked by enemy forces.

Many current turret systems are complex in design and contain numerous electrical components and assemblies. In turret systems, gimbals are typically the heart of rotational motion. These gimbals consist of two dynamic rotating components (azimuth and elevation) to accurately distinguish, track, and eliminate targets. The dynamic azimuth and elevation interfaces are bearing supported, motor driven joints that contain dynamic environmental seals. The motors are often powered with high frequency voltages that can generate extremely strong EMI emissions.

One method to suppress internally generated or externally induced EMI is a Faraday cage. A Faraday cage is an enclosure designed to exclude electromagnetic fields in an application of one of Maxwell's equations: Gauss's law. Gauss's law describes the distribution of electrical charge on an electrically conductive form, such as a sphere, a plane, a torus, a gimbal etc. Since like charges repel each other, charge will 'migrate' to the surface of the conducting form. By adding a network of conductive contacts between rotating gimbal interfaces, a Faraday cage volume can be created. As internally generated EMI approaches the inside wall of the gimbal Faraday cage volume, charge will be absorbed and transferred back to chassis ground. This absorption eliminates EMI emissions from exiting the gimbal.

Given the inherent rotational characteristics of gimbals, completing a Faraday cage volume can be difficult and expensive to accomplish. Ball bearings enable gimbals to rotate and they are generally made from low electrically conductive steel. In addition, lubricated single point bearing contacts between the inner and outer races have extremely high electrical resistance values. Electrical resistance "R", measured in Ohms $\Omega$, is a physical material property that impedes electrical current flow. In other words, a material with a high electrical resistance value is considered a poor conductor of electricity. Conversely, a material with a low electrical resistance value is a good conductor of electricity.

In many turret systems, maximum electrical resistance values are strictly enforced by customer specifications. These values are measured from the inner turret sensor, through the gimbal (including bearings and seals), and eventually to chassis ground. In past turret systems, $1\Omega$ to $4\Omega$ was considered to be an acceptable maximum resistance value. Today less than 2.5 milli-ohms is required to meet customer/program requirements. Such a change is a 1600 fold decrease in electrical resistance.

With increasingly complicated electronics, stronger torque motors, varying materials, and the general rotational dynamics of these sophisticated turrets, EMI becomes more difficult to contain and eliminate. In addition, as enemy countermeasures continue to develop, it is necessary to suppress these radiated EMI emissions even further than before.

Hence, there is a need in the art for an improved system or method for shielding systems from electromagnetic interference.

SUMMARY OF THE INVENTION

The present invention addresses the need in the art by providing a solution which increases electrical conductivity between rotating gimbal interfaces while bridging an open Faraday cage volume for EMI suppression. In accordance with the invention, a seal is taught including a base and a conductor mounted to: conduct current from a source disposed on a first side of said base to a sink disposed on a second side of said base.

In the illustrative embodiment, the base is annular (ring-shaped) and fabricated of airtight, watertight and/or electrically insulating and/or conductive material such as rubber, Teflon®, or silver impregnated Teflon® or other suitable substance. In the illustrative embodiment, the conductor is a single strip of conductive material and the base has a recess to allow for deflection thereof. In the best mode, plural conductors are mounted within the annular base. Each conductor has a brush at each end thereof. The brushes are provided by a split at the end of each strip effective to create first and second fingers. Each strip is secured at an angle in a slot in the base and retained further by an anchor. The anchor is integral with the strip and transverse to the longitudinal axis thereof.

Hence, the inventive seal provides a novel method for creating a Faraday cage including the steps of 1) providing an electromagnetic and environmental seal comprising a ring adapted to provide an environmental seal and plural conductors mounted in the ring, each conductor being a conductive strip extending through the ring on first and second sides thereof and 2) mounting the seal in a rotary joint to provide electrical conductivity between two members connected by the joint and completing the Faraday volume.

BRIEF DESCRIPTION OF THE DRAWINGS

FIG. 6 is a sectional view of the inventive environmental and electrical seal in context in an illustrative application of the present teachings.

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
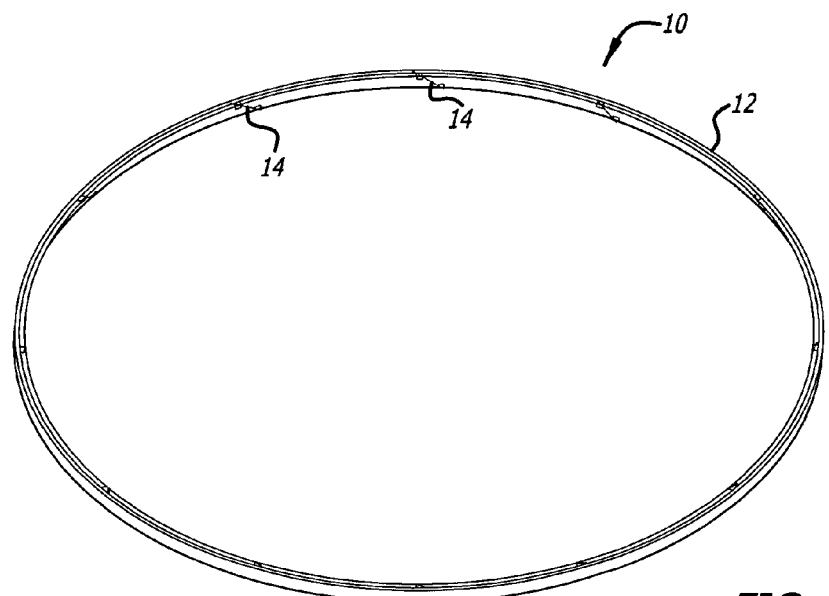
FIG. 1 is a perspective view of an electromagnetic and environmental seal implemented in accordance with the present teachings.
Figure 2:
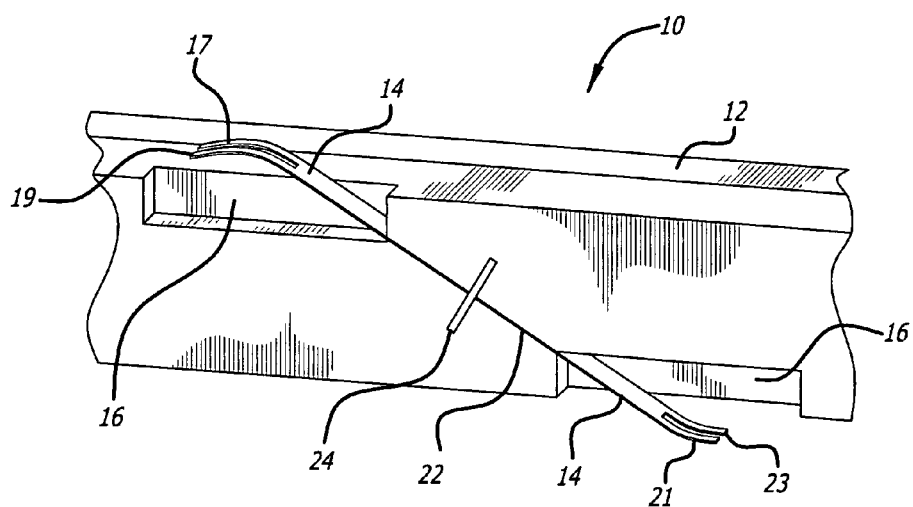
FIG. 2 is a magnified view of a portion of the inner periphery of the seal of FIG. 1.
Figure 3:
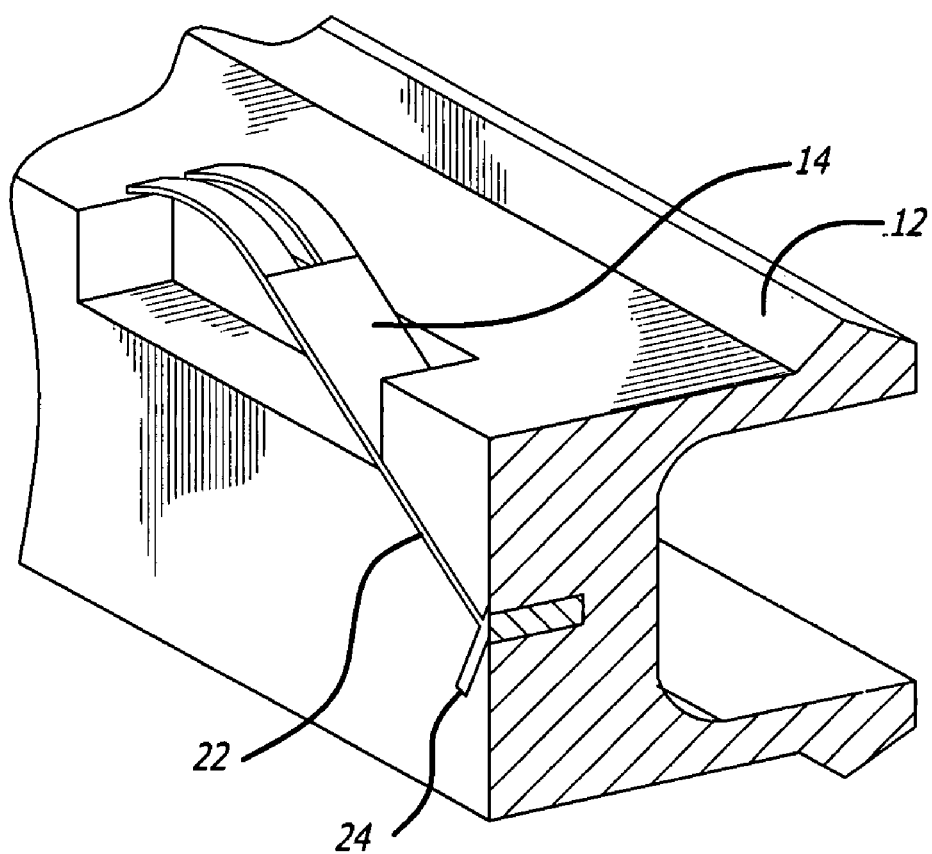
FIG. 3 is a perspective view sectional view of the seal of FIG. 1.

FIG. 1 is a perspective view of an electromagnetic and environmental seal implemented in accordance with the present teachings. FIG. 2 is a magnified view of a portion of the inner periphery of the seal of FIG. 1. FIG. 3 is a perspective view sectional view of the seal of FIG. 1.

As shown in FIGS. 1-3, the seal 10 includes an annular base 12 and a plurality of conductors 14 mounted therein to conduct current from a source disposed on a first side of the base to a sink disposed on a second side of the base. The seal shape may vary based on multiple factors including, but not limited to, physical size between two rotating sealing surfaces, desired seal location within an assembly, desired or undesired friction, allowable environmental contaminate leak rate, etc. The seal may be made from numerous electrically conductive and/or nonconductive materials including, but not limited to, graphite filled polytetraflouroethylene, fluorosilicone, rubber, etc. The seal may be spring reinforced with a conductive or non-conductive base material structure.

The conductive strips serve to greatly increase electrical conductivity between two rotating interfaces and provide a bridge to seal open Faraday cage volumes (such as in rotating gimbal components). In the illustrative embodiment, each conductor 14 is a single strip of conductive material and the base 12 has a recess therein 16, to allow for deflection thereof. The conductors may be made from any compliant electrically conductive material, e.g., gold, silver, nickel coated spring steel, etc. The number of conductors required is based on numerous considerations such as desired electrical conductivity between two rotating interfaces, desired or undesired surface friction, physical limits of size, EMI suppression requirements, EMI wavelength or frequency, etc. The conductors may be joined to the environmental seal via numerous fastening processes including, but not limited to, press fit, clamping, vulcanization, soldering, bonding, etc.

The dimensions of the seal, the electrically conductive strips, and fingertips will vary depending on the requirements of the application.

Each conductive strip 14 may be split into multiple fingertips 17, 19, 21, 23 of varying quantity acting as a brush shown at each end thereof. Each strip 14 is secured at an angle in a slot 22 in the base and may be retained further by an anchor 24.

As mentioned above, one method to suppress system generated EMI is a Faraday cage. A Faraday cage is an enclosure designed to exclude electromagnetic fields in an application of one of Maxwell's equations: Gauss's law. Gauss's law describes the distribution of electrical charge on an electrically-conductive form, such as a sphere, a plane, a torus, a gimbal etc. Since like charges repel each other, charge will 'migrate' to the surface of the conducting form. By adding a network of conductive contacts between rotating gimbal interfaces, a Faraday cage volume can be created.

Figure 4:
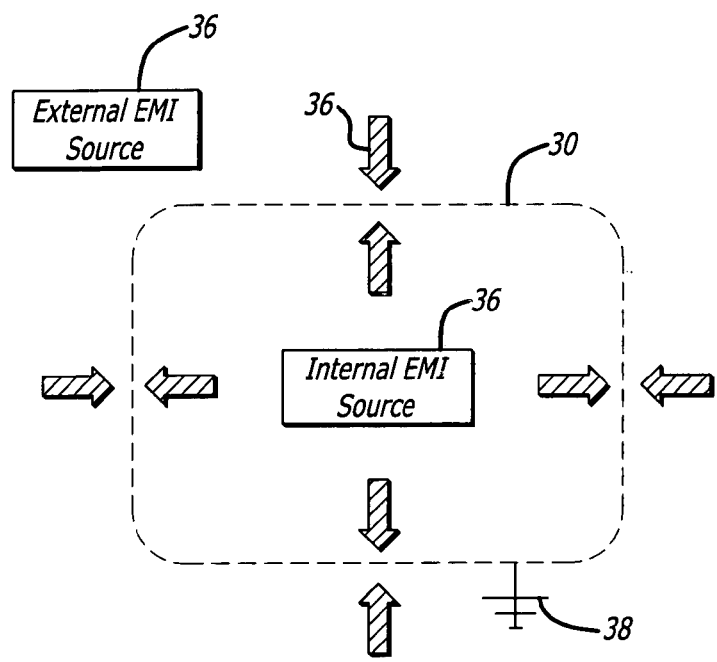
FIG. 4 is a simplified diagram of a theoretically ideal Faraday cage volume adapted to absorb EMI signals from internal and external sources.
Figure 5:
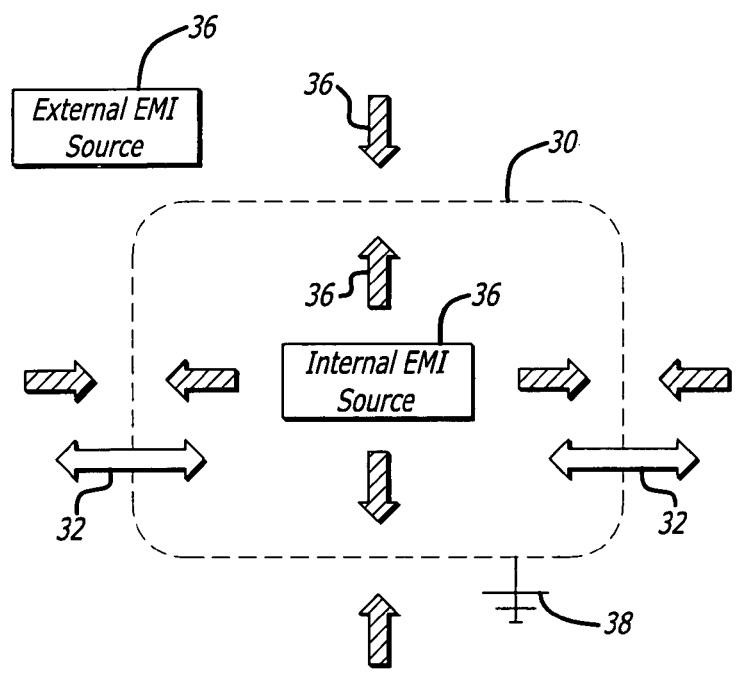
FIG. 5 is a simplified diagram of a Faraday cage volume with EMI transmissions due to poor joint conductivity.

FIG. 4 is a simplified diagram of a theoretically ideal Faraday cage volume adapted to absorb EMI signals and prohibit emissions. FIG. 5 is a simplified diagram of a Faraday cage volume with outgoing and incoming EMI emissions due to poor joint conductivity.

As illustrated in FIG. 4, as internally or externally generated EMI 36 approaches the theoretically ideal Faraday cage volume 30, charge will be absorbed and transferred back to chassis ground 38. This absorption eliminates EMI emissions from exiting or entering the gimbal.

Unfortunately, given the inherent rotational characteristics of gimbals, completing a Faraday cage volume can be difficult and expensive to accomplish. Ball bearings enable gimbals to rotate and they are generally made from low electrically conductive steel. In addition, lubricated single point bearing contacts between the inner and outer races have extremely high electrical resistance values. Electrical resistance "R", measured in Ohms Ω, is a physical material property that impedes electrical current flow. In other words, a material with a high electrical resistance value is considered a poor conductor of electricity. Conversely, a material with a low electrical resistance value is a good conductor of electricity.

In many turret systems, maximum electrical resistance values are strictly enforced by customer specifications. These values are measured from the inner sensor, through the gimbal (including bearings and seals), and eventually to chassis ground. In past systems, 1Ω to 4Ω was considered to be an acceptable maximum resistance value. Today less than 2.5 milli-ohms is required to meet customer/program requirements. Such a change is a 1600 fold decrease in electrical resistance.

With increasingly complicated electronics, stronger torque motors, varying materials, and the general rotational dynamics of these sophisticated turrets, EMI becomes more difficult to contain and eliminate. In addition, as enemy countermeasures continue to develop, it is necessary to suppress these radiated and received EMI emissions even further than before.

In short, in practice, as depicted in FIG. 5, Faraday cage volumes 30 are opened/degraded due to rotating gimbal interfaces 32 via bearings and seals as a result of the low electrical conductivity thereof. The invention provides a low cost, easy to replace, highly electrically conductive, dynamic environmental seal that protects against environmental elements and bridges an open Faraday volume gap. This is illustrated in FIG. 6.

FIG. 6 is a sectional view of the inventive environmental and electrical seal in context in an illustrative application of the present teachings. As shown in FIG. 6, the highly conductive environmental seal 10 of the present invention is disposed between a static base component 40 and a dynamic rotating component such as the yoke of a gimbal 42. The conductive strips 14 ensure a good electrical connection between the static and dynamic components 40 and 42 effective to create a Faraday volume 30 with minimal EMI leakage and penetration. Hence, internally generated EMI or external EMI exposure is absorbed by electrical conductivity between components 40 and 42.

Hence, the inventive seal provides a novel method for creating a Faraday cage including the steps of 1) providing an electromagnetic and environmental seal comprising a ring adapted to provide an environmental seal and plural conductors mounted in the ring, each conductor being a conductive strip extending through the ring on first and second sides thereof and 2) mounting the seal in a rotary joint to provide electrical conductivity between two members connected by the joint and completing the Faraday volume.

These conductive seals may be used in multiple applications to increase electrical conductivity and suppress outgoing or incoming EMI emissions between static and dynamic sides of a rotating joint. The invention may be used in numerous civilian or military platforms. Examples of system use would include Electro Optical FLIR systems, gun turrets, missile turrets, laser turrets, sensor turrets, EMI sensitive equipment and other unspecified uses herein.

Thus, the present invention has been described herein with reference to a particular embodiment for a particular application. Those having ordinary skill in the art and access to the present teachings will recognize additional modifications applications and embodiments within the scope thereof.

It is therefore intended by the appended claims to cover any and all such applications, modifications and embodiments within the scope of the present invention.

The invention claimed is:

1. A rotary seal arranged at a rotary joint of a system, comprising:
    a base; and
    a conductor comprising a single strip of conductive material mounted in said base to conduct current from a source of the rotary joint, disposed on a first side of said base,
    to a sink of the rotary joint, disposed on a second side of said base, wherein said strip has a brush at each end thereof,
    wherein said conductor and said brush are arranged to suppress electromagnetic interference leakage and/or penetration through said rotary joint while the conductor and the brush rotate with respect to said source or said sink.

2. The seal of claim 1 wherein said base is annular.

3. The seal of claim 2 wherein said base is fabricated with an insulator or electrically conductive material.

4. The seal of claim 3 wherein said base is rubber.

5. The seal of claim 3 wherein said base comprises polytetrafluoroethylene (PTFE).

6. The seal of claim 1 wherein said base has a recess to allow for deflection of said conductor.

7. The seal of claim 1, wherein each brush comprises a split at an end of said strip effective to create first and second fingers thereon.

8. The seal of claim 1, wherein said strip comprises an anchor.

9. The seal of claim 8 wherein said anchor is integral with said strip.

10. The seal of claim 9 wherein said anchor is transverse to a longitudinal axis of said strip.

11. The seal of claim 1, wherein said strip is secured in a slot in said base.

12. The seal of claim 11 wherein said strip is secured in an angle in said base.

13. The seal of claim 1 including plural conductors.

14. The seal of claim 13 wherein each of said plural conductors comprises a single strip of conductive material.

15. The seal of claim 13 wherein each strip has a brush at each end thereof.

16. The seal of claim 15 wherein each brush is provided with a split at an end of each strip effective to create first and second fingers.

17. The seal of claim 13 wherein each strip includes an anchor.

18. The seal of claim 17 wherein each anchor is integral with a respective strip.

19. The seal of claim 18 wherein each anchor is transverse to a longitudinal axis of said respective strip.

20. The seal of claim 13 wherein each strip is secured in a slot in said base.

21. The seal of claim 20 wherein said strip is secured in an angle in said base.

22. An electromagnetic and environmental rotary seal, comprising:
    a ring adapted to provide an environmental seal; and
    plural conductors mounted in said ring, each of said plural conductors comprising a conductive strip extending through said ring on first and second sides thereof, wherein each said conductive strip has a brush at an end thereof,
    wherein said plural conductors and associated brushes are arranged to suppress electromagnetic interference leakage and/or penetration through said electromagnetic and environmental rotary seal while a body arranged on one of said first and second sides of the ring rotates with respect to said ring.

23. The seal of claim 22 wherein said ring is fabricated with an insulator.

24. The seal of claim 23 wherein said insulator is rubber.

25. The seal of claim 24 wherein said insulator comprises polytetrafluoroethylene (PTFE).

26. The seal of claim 22 wherein said ring has recesses therein to allow for deflection of said conductors.

27. The seal of claim 22, wherein each brush is provided by a split at the end of each strip effective to create first and second fingers.

28. The seal of claim 22 wherein each strip includes an anchor.

29. The seal of claim 22 wherein each strip is secured in a slot in said ring.

30. The seal of claim 22 wherein said strip is secured in an angle in said ring.

31. A method for creating a Faraday cage, the method comprising:
    providing an electromagnetic and environmental seal comprising:
        a ring adapted to provide an environmental seal, and
        plural conductors mounted in said ring, each conductor being a conductive strip extending through said ring on first and second sides thereof, wherein each said conductive strip has a brush at an end thereof;
    mounting said seal in a rotary joint to provide said Faraday cage between two members connected by said rotary joint; and
    enabling relative rotary motion between each said conductive strip and said ring one or more bodies outside said Faraday cage while reducing an amount of electromagnetic interference that passes outside said Faraday cage.

* * * * *